United States Patent [19]
den Boer et al.

[11] Patent Number: 5,532,180
[45] Date of Patent: Jul. 2, 1996

[54] METHOD OF FABRICATING A TFT WITH REDUCED CHANNEL LENGTH

[75] Inventors: Willem den Boer; Tieer Gu, both of Troy, Mich.

[73] Assignee: OIS Optical Imaging Systems, Inc., Northville, Mich.

[21] Appl. No.: 460,248

[22] Filed: Jun. 2, 1995

[51] Int. Cl.⁶ .......................... H01L 21/28; H01L 21/84
[52] U.S. Cl. .............. 437/40; 437/41; 437/101; 437/181
[58] Field of Search .......................... 437/21, 40, 41, 437/101, 181, 909, 48, 50, 51; 257/59

[56] References Cited

U.S. PATENT DOCUMENTS

| | | |
|---|---|---|
| 4,618,873 | 10/1986 | Sasano et al. . |
| 4,723,838 | 2/1988 | Aoki et al. . |
| 4,862,234 | 8/1989 | Koden . |
| 4,949,141 | 8/1990 | Busta . |
| 5,045,485 | 9/1991 | Tanaka et al. . |
| 5,047,819 | 9/1991 | Tanaka et al. . |
| 5,051,800 | 9/1991 | Shoji et al. . |
| 5,055,899 | 10/1991 | Wakai et al. . |
| 5,071,779 | 12/1991 | Tanaka et al. . |
| 5,075,674 | 12/1991 | Katayama et al. . |
| 5,091,337 | 2/1992 | Watanabe et al. ............. 437/41 |
| 5,137,841 | 8/1992 | Takeda et al. . |
| 5,153,142 | 10/1992 | Hsieh ................................... 437/40 |
| 5,153,754 | 10/1992 | Whetten . |
| 5,156,986 | 10/1992 | Wei et al. . |
| 5,162,931 | 11/1992 | Holmberg . |
| 5,294,811 | 3/1994 | Aoyama et al. . |
| 5,355,002 | 10/1994 | Wu . |
| 5,367,392 | 11/1994 | Janai . |

*Primary Examiner*—Mary Wilczewski
*Attorney, Agent, or Firm*—Myers, Liniak & Berenato

[57] ABSTRACT

A thin film transistor (TFT) having a reduced channel length and method of making same are disclosed for liquid crystal display (LCD) applications. The method of making the TFT includes the following process steps: (i) depositing and patterning the gate on a substrate; (ii) depositing and patterning an intrinsic a-Si layer, a n+ a-Si layer, and a source metal layer (e.g. Cr) over the gate; (iii) depositing and patterning an ITO layer to form a pixel electrode portion and a TFT source portion; (iv) etching the source metal layer so that it remains only under the ITO source portion so as to form the TFT source electrode; (v) depositing and patterning a metal (e.g. Mo) to form the drain of the TFT; and (vi) etching the n+ a-Si layer in the TFT channel area so that only the intrinsic semiconductor layer remains between the source and drain. The resulting TFT has a reduced channel length (e.g. less than about 4 μm) less than the feature size of the lithography used so as to maximize $I_{ON}/C_{gs(ON)}$ of the TFT. Maximizing $I_{ON}/C_{gs(ON)}$ reduces pixel flickering, gray scale non-uniformity, and image retention in LCD applications.

14 Claims, 6 Drawing Sheets

5,532,180

1

METHOD OF FABRICATING A TFT WITH REDUCED CHANNEL LENGTH

This invention relates to an array of thin film transistors and method of making same, each transistor having a reduced channel length. More particularly, this invention relates to an array of thin film transistors (TFTs) adapted to be used in an LCD, each TFT having a channel length capable of being less than the feature size of the lithography used so as to reduce gate-source capacitance which in turn reduces pixel flickering and image retention thereby improving the viewing characteristics of the LCD.

BACKGROUND OF THE INVENTION

Active matrix liquid crystal display (AMLCD) devices are typically composed of a matrix of liquid crystal pixels arranged horizontally in rows and vertically in columns. Such devices include first and second opposing polarizers, a liquid crystal layer disposed between the polarizers, and substantially transparent electrodes mounted on opposite sides of the liquid crystal (LC) layer so as to selectively energize same in order to create an image for a viewer.

Electronic matrix arrays find considerable applications in AMLCDs. Such AMLCDs generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are liquid crystal display pixels or alternatively the memory cells of an electronically adjustable memory array.

Typically, an isolation device (e.g. TFT) is associated with each array element or pixel. The isolation devices permit the individual pixels to be selectively addressed by the application of suitable potentials between respective pairs of the X and Y address lines.

Amorphous silicon (a-Si) TFTs have found wide usage for isolation devices in LCD arrays. Thin film transistors (TFTs) formed from deposited semiconductors such as amorphous silicon alloys are ideally suited for these applications because they exhibit a high dark resistivity and therefore have low OFF state currents. The leakage currents are low so that high ON-to-OFF current ratios are made possible for effectively isolating non-addressed array pixels from the pixels being addressed.

Structurally, TFTs generally include substantially co-planar source and drain electrodes, a semiconductor material between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted.

Source and drain electrodes in conventional TFT arrays are typically deposited and patterned on a substrate by way of either flat panel steppers or large area scanning projection aligners in order to define a TFT channel length and width between the source and drain. Large area scanning projection aligners using a single large area mask typically cost about half as much as flat panel steppers, and have about twice the manufacturing throughput as the steppers. Conventional scanning projection aligners typically have a resolution of from about 4 to 6 µm while conventional flat panel steppers typically have a resolution of from about 3 to 4 µm. In consideration of costs and manufacturing throughput, it is clear that it would be desirable to utilize scanning projection aligners as opposed to flat panel steppers so as to decrease manufacturing costs and increase production throughput.

TFT channel lengths smaller than those achievable with certain scanning projection aligners are often desirable for reasons to be discussed below. Typically, TFT source-drain channel lengths of about 6 µm can be obtained with the above-referenced scanning projection aligners. However, it is often desirable to achieve channel lengths less than about 6 µm.

The resulting channel length of a TFT is typically larger or longer than the feature size of the aligner used due to overetching of the source and drain. In the case of Mo source-drain metal, for example, the overetch is typically about 1 µm so that a designed channel of 4 µm ends up as a post-processing TFT channel length of about 6 µm. As a result of this, the channel width must be increased accordingly in order to maintain the same ON current because the TFT ON current is proportional to W/L where "W" is the channel width and "L" is the channel length. Accordingly, there exists a need in the art for a TFT (and method of making same) having a channel length smaller than that allowed by the minimum feature size or resolution of the equipment used to manufacture the TFT so that, for example, a 4 µm channel length or less can be achieved using low-cost equipment such as scanning projection aligners (instead of flat panel steppers).

Small TFT channel lengths are desirable for the following reasons. Pixel voltage shift $\Delta V_p$ in thin film transistor LCDs after switching off the gate electrode is proportional to the gate-source capacitance ($C_{gs}$) of the TFT. $\Delta V_p$ can cause flicker, image retention, and gray level non-uniformity in LCD operation. An effective way to reduce $C_{gs}$ (i.e. parasitic or gate-source capacitance) is by shortening the channel length of the TFT. When a channel length is reduced, the channel width "W" can be reduced proportionally so as to decrease $C_{gs}$ because $C_{gs}$ is proportional to the channel width. Such reduction in channel width is permitted while the same $I_{ON}$ of the TFT is maintained due to the reduced channel length. This reduction in channel width is a major contributor in reducing $C_{gs}$.

FIG. 1 is a side elevational cross-sectional view of prior art linear thin film transistor (TFT) 1. A plurality of TFTs 1 are typically arranged on transparent insulating substrate 3 in the form of a matrix array in AMLCD applications. Each TFT 1 includes gate electrode 5 connected to a gate line (not shown) extending in the row direction, drain electrode 7 connected to a drain line (not shown) extending in the column direction, and source electrode 9 connected to transparent pixel electrode 11 independently formed in an area surrounded by the gate and drain lines. Pixel electrode 11 operates in conjunction with an opposing electrode (not shown) on the other side of the liquid crystal layer (not shown) so as to selectively drive the pixel enabling the respective polarizers to transmit or absorb light rays in order to create an image for the viewer. A TFT electrode, to which a data signal is supplied, will be referred to hereinafter as a drain electrode, while the TFT electrode attached to the pixel electrode will be referred to as a source electrode.

More specifically, gate electrode 5 is formed on clear substrate 3. Gate insulating film 13, made of silicon oxide or silicon nitride, for example, is formed on the upper surface of substrate 3 and on the upper surface of gate electrode 5. Semiconductor film 15, made of amorphous silicon (a-Si), for example, is stacked on gate insulating film 13 above gate 5. Drain and source electrodes 7 and 9 respectively are formed on semiconductor film 15. The linear shaped source and drain electrodes are separated from one another by a predetermined distance forming channel length 17. Drain and source electrodes 7 and 9 utilize doped a-Si contact layers 7a and 9a, and drain-source metal layers 7b and 9b respectively, and are electrically connected to semiconductor film 15.

Unfortunately, when TFT 1 is manufactured using, for example, a conventional scanning projection aligner to position the source and drain electrodes on substrate 3, the resulting channel length 17 of TFT 1 cannot be made as small as desired thereby resulting in an undesirably high parasitic capacitance ($C_{gs}$). Because drain 7 and source 9 of TFT 1 are deposited and patterned in the same manufacturing step, the resulting channel length 17 of TFT 1 is limited by the feature size or resolution of the lithography used in making the TFT. High parasitic capacitance values for TFTs are undesirable as set forth above because they tend to cause pixel flickering, image retention, and gray scale non-uniformity. As the parasitic capacitance of a TFT is decreased, the pixel voltage shift when the gate is switched off becomes smaller. As the pixel voltage shift decreases, it becomes easier to compensate the top plate voltage to eliminate DC components for all gray levels and across the entire display area.

Flickering results from a small DC component across the pixel electrodes spanning the LC layer. Pure AC voltage across the electrodes is ideal. By reducing $C_{gs}$, the DC component across the pixel electrodes can be substantially eliminated or reduced thereby greatly reducing pixel flickering, image retention, and electrochemical degradation of the LC material.

In order to improve such LCD viewing characteristics, it is sometimes necessary to reduce the channel length of the TFT. However, as set forth above, channel length 17 of TFT 1 is limited to a size dictated by the minimum feature size of the lithography used in patterning the source and drain electrodes because the source and drain are deposited and patterned in the same manufacturing step.

In view of the above, it is apparent that there exists a need in the art for an LCD including a TFT array wherein the TFTs in the array have reduced $C_{gs}$ and are cost effective to manufacture. Such TFTs are achievable in accordance with this invention by way of an improved TFT manufacturing process which results in TFT channel lengths smaller than those obtainable with the minimum feature size of the lithography used, thereby resulting in reduced $C_{gs}$ values (and increased $I_{ON}/C_{gs(ON)}$ values) so that pixel flickering, image retention, and gray scale non-uniformity of the LCD are decreased. It is a purpose of this invention to fulfill the above-described needs in the art by way of an improved TFT and method of manufacturing same, as well as other needs in the art which will become more apparent to the skilled artisan once given the following disclosure.

SUMMARY OF THE INVENTION

Generally speaking, this invention fulfills the above-described needs in the art by providing a method of making a thin film transistor (TFT), the method comprising the steps of:

a) depositing and patterning a gate metal on a substrate to form a gate electrode;

b) depositing and patterning a semiconductor layer, a doped semiconductor contact layer, and a source metal layer over the gate electrode to form a TFT island or region, the doped semiconductor layer being deposited between the semiconductor layer and the source metal layer;

c) depositing and patterning over the source metal layer a substantially transparent metal layer so as to form a pixel electrode portion and a source electrode portion;

d) etching the source metal layer after the patterning in steps c) so that the source metal is substantially etched except for under the source electrode portion of the substantially transparent metal layer thereby forming a source electrode; and e) depositing and patterning a drain metal to form a drain electrode so that the TFT channel length is defined between the source electrode and the drain electrode.

In certain preferred embodiments of this invention, steps b)–e) are performed so that the resulting TFT channel length is less than about 4 μm thereby increasing $I_{ON}/C_{gs(ON)}$ of the TFT so as to reduce pixel flickering and image retention in LCD applications.

This invention further fulfills the above-described needs in the art by providing a liquid crystal display comprising:

a liquid crystal layer;

an array of pixel electrodes for applying a voltage across the liquid crystal layer;

an array of thin film transistors (TFTs) corresponding to the array of pixel electrodes, a plurality of the thin film transistors comprising:

a) a gate electrode connected to a gate address line;

b) a drain electrode of a first metal connected to a drain address line;

c) a source electrode of a second metal connected to a corresponding one of the pixel electrodes, the second metal being different than the first metal; and d) wherein the source and drain electrodes are deposited and patterned in separate steps using different etchants so that the channel length of the transistor may be less than the feature size of the lithography used.

In certain preferred embodiments of this invention, the thin film transistor is substantially U-shaped so that the drain electrode surrounds the source electrode on at least three sides thereby reducing offset problems.

This invention will now be described with respect to certain embodiments thereof, along with reference to the accompanying illustrations wherein:

IN THE DRAWINGS

Figure 1:
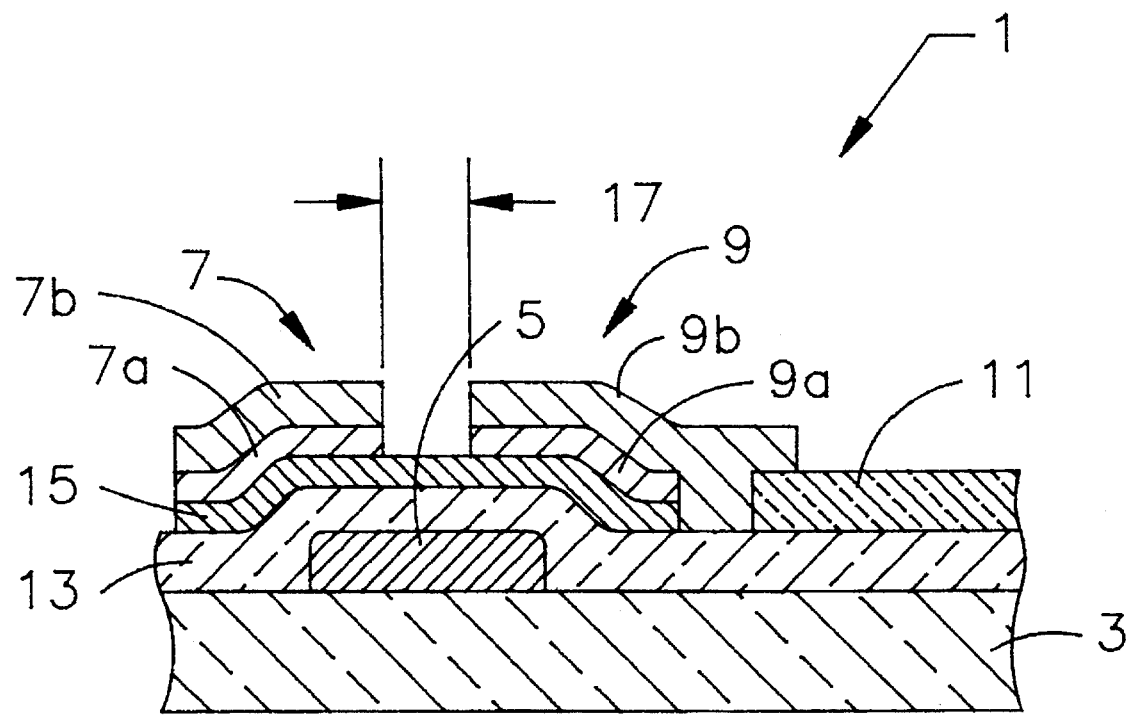
FIG. 1 is a side elevational cross-sectional view of a prior art linear-type TFT where the source and drain electrodes are deposited and patterned in the same manufacturing steps so that the resulting TFT channel length is limited by the minimum feature size of the lithography used.
Figure 2:
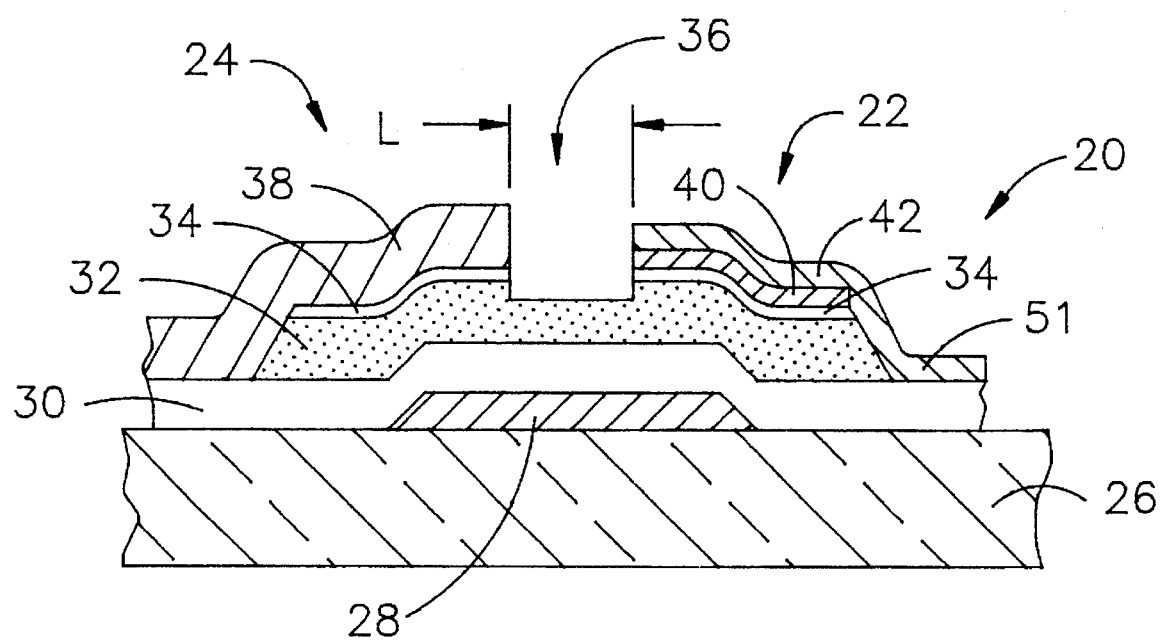
FIG. 2 is a side elevational cross-sectional view of a linear TFT according to an embodiment of this invention.
Figure 3A:
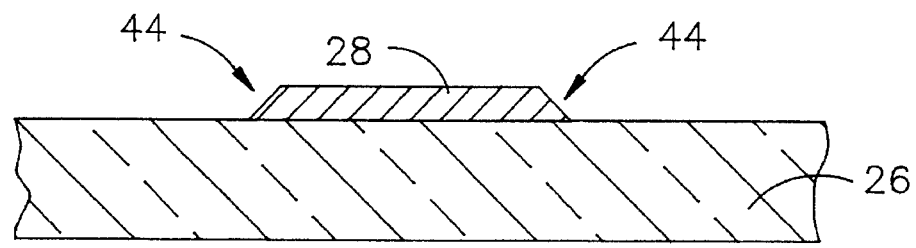
Figure 3B:
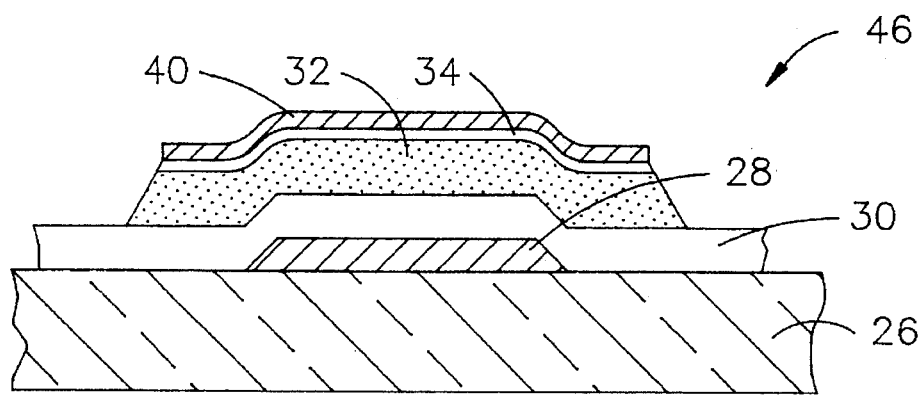
Figure 3C:
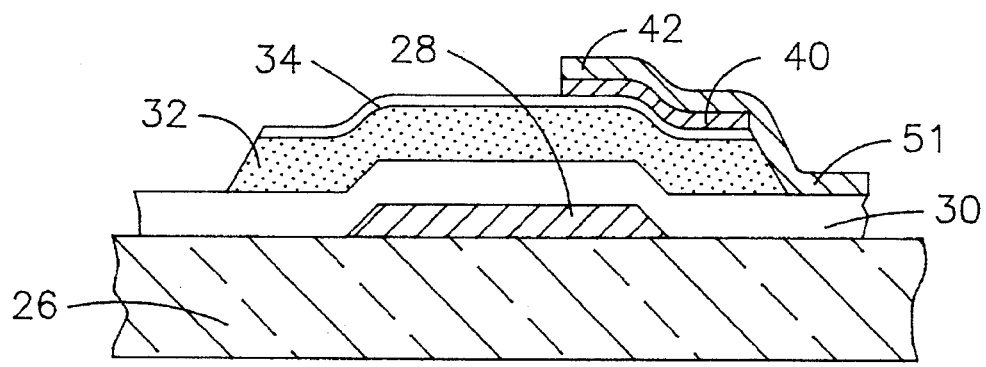

FIGS. 3(a), 3(b), and 3(c) are side elevational cross-sectional views of the FIG. 2 TFT in accordance with different manufacturing steps.

Figure 4:
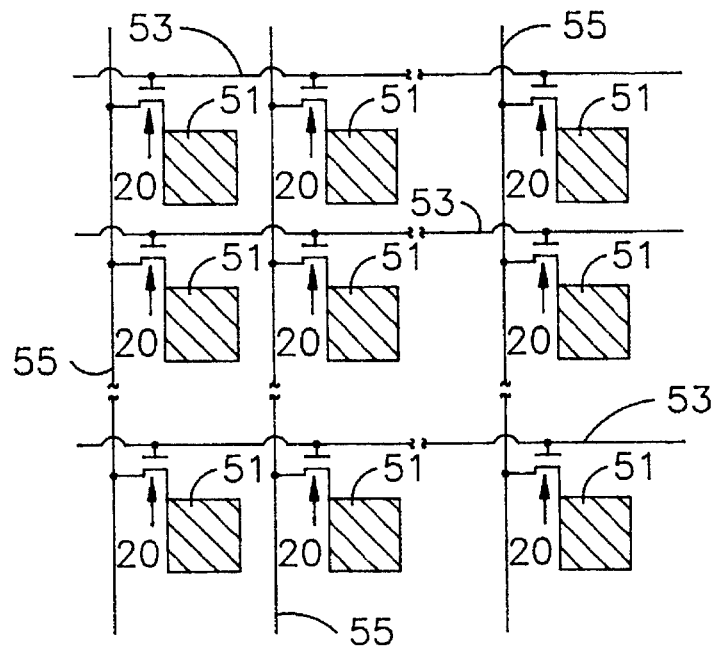

FIG. 4 is a diagram of a TFT array in an LCD including a plurality of the FIG. 2 TFTs connected to respective gate and drain address lines.

Figure 5:
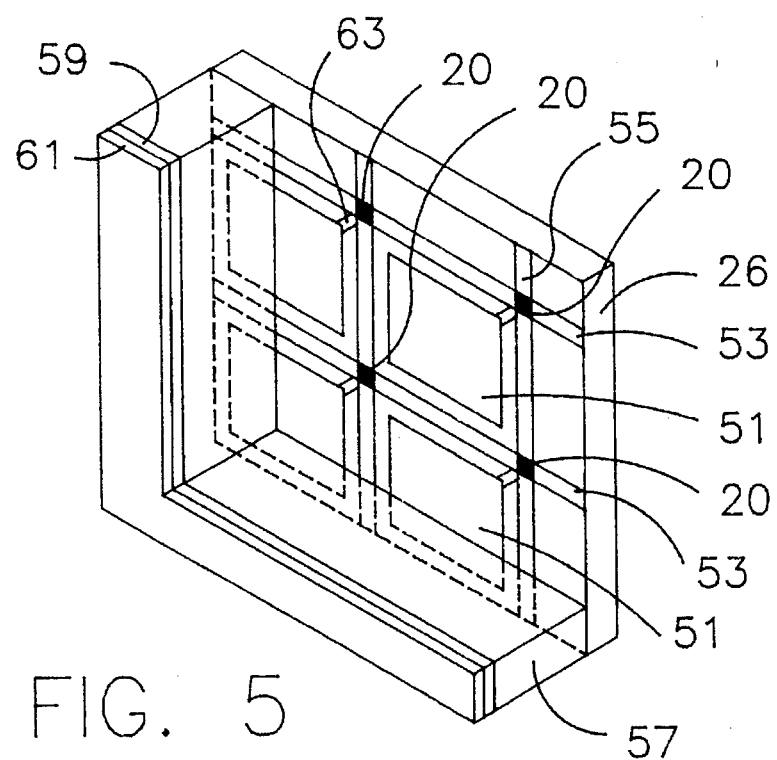

FIG. 5 is a partial cut-away perspective view of an AMLCD including a plurality of the FIG. 2 TFTs arranged in an array so as to act as switching devices for the AMLCD pixels.

Figure 6:
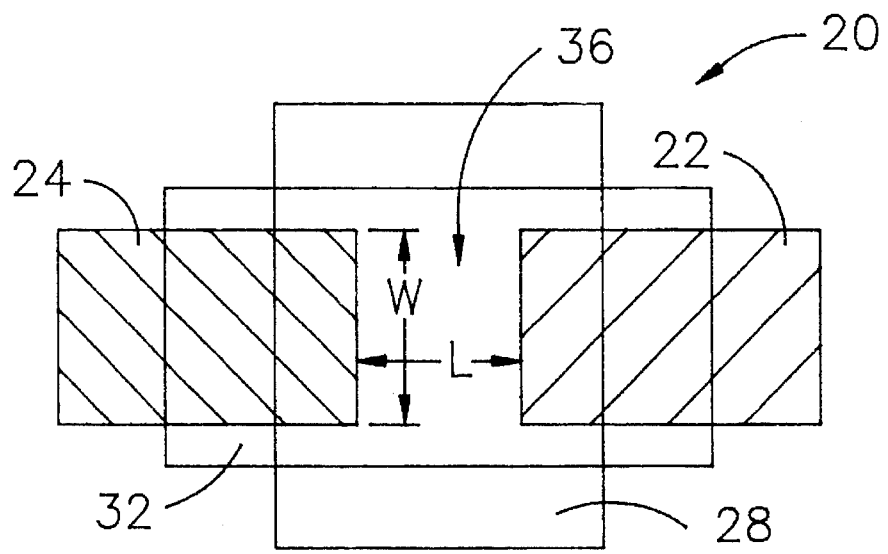

FIG. 6 is a top view illustrating the linear-type TFT of FIG. 2, where the source and drain electrodes are illustrated cross-sectionally and the gate and semiconductor layers are shown in a top elevational manner.

Figure 7:
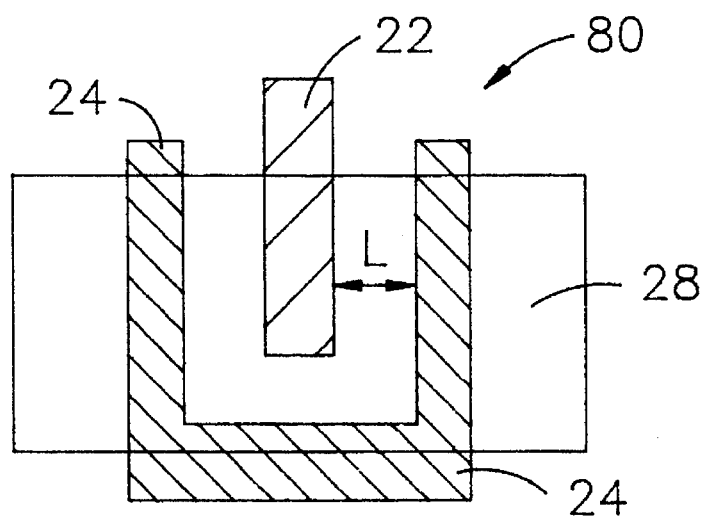

FIG. 7 is a top view of a U-shaped TFT according to another embodiment of this invention, where the drain electrode surrounds the source on substantially three sides so as to define the U-shape, and where this TFT is made by substantially the same manufacturing steps as those set forth in FIGS. 2 and 3.

Figures 8A, 8B:
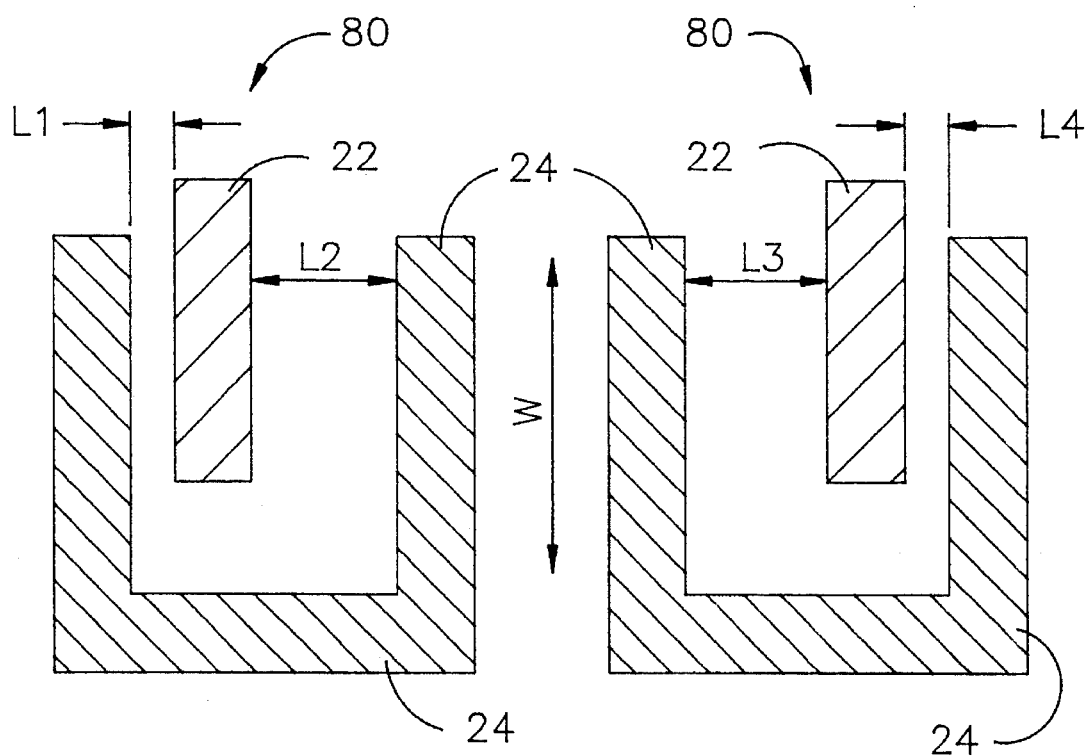

FIGS. 8(a) and 8(b) are top views of the FIG. 7 U-shaped TFT illustrating its advantages with respect to misalignment problems.

DETAILED DESCRIPTION OF CERTAIN EMBODIMENTS OF THIS INVENTION

Referring now more particularly to the following illustrations where like reference numerals indicate like parts throughout the several views.

FIG. 2 is a side cross-sectional view of linear thin film transistor (TFT) 20 according to an embodiment of this invention. TFT 20 has a channel length "L" which may be shorter than that allowed by the feature size (or resolution) of the lithography (e.g. when a scanning projection aligner or flat panel stepper is used) used for patterning source electrode 22 and drain electrode 24 thereby reducing $C_{gs}$ of the TFT.

Source electrode 22 is connected to LCD pixel electrode 51 (see FIGS. 4–5) so as to permit TFT 20 to selectively energize a corresponding pixel in the LCD so as to provide image data to a viewer. Thus, linear TFT 20 effectively functions as a switch for the corresponding LCD pixel. An array of TFTs 20 is provided in a typical AMLCD so as to correspond with an array of pixel electrodes 51.

TFT 20 includes transparent substrate 26 (e.g. made of glass), metal gate electrode 28, gate insulating layer or film 30, semiconductor layer 32 (e.g. intrinsic amorphous silicon), doped semiconductor contact layer 34, drain electrode 24, and source electrode 22. TFT channel 36 of length "L" is defined between source 22 and drain 24.

Drain electrode 24 includes drain metal layer 38 (e.g. Mo) which is deposited on substrate 26 over top of doped contact layer 34. Contact film or layer 34 may be, for example, amorphous silicon doped with an impurity such as phosphorous (i.e. n+ a-Si) and is sandwiched between semiconductor layer 32 and drain metal layer 38.

Source electrode 22 includes doped semiconductor contact layer 34, source metal layer 40 (e.g. Cr), and substantially transparent source metal layer 42, all of which combine with drain electrode 24 to define TFT channel length "L". Substantially transparent source metal layer 42 and pixel electrode 51 are of the same material and are deposited together on substrate 26 over layers 34 and 40 in the same step thereby making up a single layer according to certain embodiments of this invention. Thus, portion 42 of the substantially transparent metal layer functions as a part of source electrode 22 and defines TFT channel 36 in combination with drain 24 while the other portion 51 of the layer forms the pixel electrode. This substantially transparent metal layer (42 and 51) is made of indium-tin-oxide (ITO) according to certain embodiments of this invention, however, other suitable materials may be used.

Not including contact layer 34, source 22 and drain 24 are deposited on substrate 26 and semiconductor layer 32 in separate manufacturing deposition steps so that the resulting TFT channel 36 length "L" is not limited to the feature size of the lithography used in manufacturing. Accordingly, channel 36 may have a length "L" less than the feature size of the lithography used. Exemplary channel lengths "L" according to certain embodiments of this invention are from about 2 to 6 µm, preferably from about 3 to 4 µm, and most preferably about 3 µm. Such reduced channel lengths "L" in combination with a reduced TFT channel width "W" reduce pixel flickering, image retention, and gray-level non-uniformity in LCD applications. It will be recognized by those of skill in the art that TFTs with larger channel lengths may also be made in accordance with certain embodiments of this invention.

With reference to FIGS. 2 and 3(a)–3(c), it will now be explained how linear TFT 20 is manufactured. Beginning with FIG. 3(a), a gate metal layer (which results in gate 28) is deposited on the top surface of substrate 26 to a thickness of from about 1,000–5,000 Å, most preferably to a thickness of about 2,500 Å. The gate metal is deposited by way of sputtering or vapor deposition. The gate metal may be made of tantalum (Ta) according to certain embodiments of this invention. Insulating substrate 26 may be made of glass, quartz, sapphire, or the like.

The structure including substrate 26 and the deposited gate metal layer (Ta) is then photomasked to provide a mask pattern corresponding to the desired gate electrode 28 configuration and optionally the row address lines. The upper surface of the gate metal is exposed in a window where the photoresist has not been retained. Next, the gate metal layer is dry etched (preferably using reactive ion etching) in order to pattern the gate metal layer in accordance with the retained photoresist pattern. To do this, the structure is mounted in a reactive ion etching (RIE) apparatus which is then purged and evacuated in accordance with known RIE procedures and etchants. This etching of the gate metal layer is preferably carried out until the gate metal is removed in center areas of the windows and is then permitted to proceed for an additional time (e.g. 20 to 40 seconds) of overetching to ensure that the gate metal is entirely removed from within the windows. The result is gate electrode 28 on top of substrate 26 as illustrated in FIG. 3(a).

The sloped edges 44 of gate electrode 28 result from the photoresist being etched back from its originally defined edge as the gate metal etching takes place. Sloped portions 44 are provided in RIE in part because when the photoresist is baked after patterning to toughen it prior to RIE etching, the photoresist slumps with the result being that its thickness tapers from small or zero at the edge of the photoresist region upward to a central thickness of the photoresist over a finite distance. During RIE, the photoresist erodes as the gate metal is etched with the result being tapers 44 produced on the retained portion 28 of the gate metal. Tapered gate electrode 28 as illustrated in FIG. 3(a) may be provided in a variety of other ways well-known in the art including reliance on the erosion of the photoresist during etching of the gate conductor where RIE is employed, or an isotropic wet etch may be employed which undercuts the resist during etching of the unprotected portion of the gate metal.

After gate electrode 28 is deposited and patterned on the top of transparent substrate 26 in the above-described manner, gate insulating or dielectric layer 30 is deposited over the entire substrate 26 preferably by plasma enhanced chemical vapor deposition (CVD) or some other process known to produce a high integrity dielectric. Gate insulating layer 30 is preferably silicon nitride ($Si_3N_4$) but may also be silicon dioxide or other known dielectrics. Gate insulating layer 30 is deposited to a thickness of from about 2,000–3,000 Å (preferably either about 2,000 Å or 3,000 Å).

It is noted that after anodization (which is optional), gate metal layer 28 which was deposited as the gate electrode (when Ta and originally about 2,500 Å thick) is about 1,800 Å thick and a newly created TaO layer is about 1,600 Å thick. Thus, gate insulating layer 30 over gate 28 as shown in FIGS. 2 and 3(b) is made up of both the anodization created TaO layer and the silicon nitride layer. Other metals from which gate electrode 28 may be made include Cr, Al, titanium, tungsten, copper, and combinations thereof.

Next, after layer 30 has been deposited, semiconductor (e.g. intrinsic a-Si) layer 32 is deposited on gate insulating layer 30 to a thickness of about 2,000 Å. Semiconductor layer 32 may be from about 1,000 Å to 4,000 Å in certain embodiments of this invention. Then, doped (typically phosphorous doped, that is n+) amorphous silicon contact layer 34 is deposited over intrinsic a-Si layer 32 in a known manner to a thickness of, for example, about 500 Å. Doped contact layer 34 may be from about 200 Å to 1,000 Å thick according to certain embodiments of this invention.

Gate insulating layer 30, semiconductor layer 32, and semiconductor contact layer 34 may all be deposited on substrate 26 in the same deposition chamber without breaking the vacuum according to certain embodiments of this invention. When this is done, the plasma discharge in the deposition chamber is stopped after the completion of the deposition of a particular layer (e.g. insulating layer 30) until the proper gas composition for deposition of the next layer (e.g. semiconductor layer 32) is established. Subsequently, the plasma discharge is re-established to deposit the next layer (e.g. semiconductor layer 32). Alternatively, layers 30, 32, and 34 may be deposited in any known manner in different chambers.

Thereafter, a source metal layer (which results in patterned source layer 40) is deposited on substrate 26 over top of semiconductor layer 32 and contact layer 34. This source metal is Cr (chromium) according to certain embodiments of this invention. Cr layer 40 is deposited to a thickness of from about 500–2,000 Å, preferably about 1,000 Å according to certain embodiments. Other metals which may be used for source metal 40 include titanium, Al, tungsten, tantalum, copper, Mo, or the like.

Next, source metal layer 40, contact layer 34, and semiconductor layer 32 are patterned by photolithography or the like so as to define a TFT area or island 46 above gate electrode 28 as shown in FIG. 3(b). First, a photoresist is used to coat and expose TFT islands 46. Then the Cr etchant is used to etch Cr layer 40. Thereafter, RIE is used to remove the exposed portions of layers 34 and 32 to form island 46. The etchant for Cr layer 40 is the known mixture of ceric ammonium nitrate and nitric acid in deionized water according to certain embodiments of this invention.

After island 46 (shown in FIG. 3(b)) is formed, a substantially transparent metal layer (e.g. ITO) which results in metal layer 42, 51, is deposited and patterned on substrate 26 over top of layer 40 to form pixel electrode 51 and source electrode portion 42 of TFT 20. The substantially transparent metal layer is deposited to a thickness of from about 1,200 to 1,500 Å (preferably about 1,400 Å) according to certain embodiments of this invention.

After the substantially transparent metal layer is patterned using a standard etchant to form source electrode portion 42 and pixel electrode 51, Cr layer 40 is etched so that it only remains underneath of transparent metal source portion 42 as shown in FIG. 3(c). In other words, Cr layer 40 is etched again so that it is transformed from its FIG. 3(b) form to its source electrode form shown in FIG. 3(c). After this second etching of Cr layer 40, the result is the structure shown in FIG. 3(c).

After the FIG. 3(c) TFT structure is formed, a drain metal layer (e.g. Mo) is deposited on substrate 26 over the FIG. 3(c) structure to a thickness of from about 2,000–7,000 Å, preferably about 5,000 Å. Thereafter, the Mo drain layer is patterned to form drain 38 and the corresponding column or drain address lines 55. The Mo etchant may be a known mixture of phosphoric acid, acetic acid, nitric acid, and deionized water according to certain embodiments.

Following the deposition and patterning of Mo drain 38, n+ a-Si contact layer 34 is etched in order to define TFT channel 36 of length "L" as shown in FIG. 2 so that only intrinsic a-Si 32 is left between the source and drain electrodes. During the n+ a-Si layer 34 etching, a small portion of a-Si layer 32 is inevitably etched, in order to ensure that all of the n+ a-Si is removed, thus resulting in TFT 20 as shown in FIG. 2.

Following formation of TFT 20 as shown in FIG. 2, a passivation layer (not shown) of silicon nitride may be deposited on the upper surface of TFT 20. The passivation layer (from about 2,000–4,000 Å thick, preferably about 2,000 Å) is then removed only from the pixel electrode 51 areas in certain embodiments so as to maximize the stability of the characteristics of TFT 20.

In sum, the channel length "L" of TFT 20 can be made smaller than the minimum feature size of the lithography used because source 22 and drain 24 are patterned separately. The uniformity of "L" across the TFT 20 array area in LCD applications depends upon the overlay accuracy of the masks and exposure equipment used. Total overlay accuracy is typically about four times better than resolution. An array of TFTs 20 with some variation in "L" across the LCD viewing area (e.g. from 4 to 6 µm) has better display performance than prior art TFTs with substantially constant channel lengths "L" (e.g. of about 10 µm).

FIG. 4 illustrates an array of thin film transistors (TFTs) 20 which act as switching elements for LCD pixel electrodes 51. Each TFT 20 is electrically connected to a row address line 53 and a column address line 55. For example, row address lines 53 are connected to TFT gate electrodes 28 while column address lines 55 are connected to TFT drain electrodes 24.

FIG. 5 is a perspective partial cut-away view of an AMLCD including an array of TFTs 20 which act as switching elements for pixel electrodes 51. The AMLCD includes liquid crystal layer 57 sandwiched between substrate 26 and substrate 61. Common electrode 59 is positioned adjacent liquid crystal layer 57 and is located between LC layer 57 and substrate 61. TFTs 20 are connected to pixel electrodes 51 (e.g. ITO) by way of conductive ITO connecting portions 63.

The often-described figure of merit for a TFT is $I_{ON}/C_{gs(ON)}$. The reduced channel length "L" of TFTs 20 according to different embodiments of this invention reduces pixel flickering, image retention, and gray level non-uniformity by increasing $I_{ON}/C_{gs(ON)}$. In other words, this figure of merit is the TFT ON current divided by the TFT gate-source capacitance in the ON state. It is desirable to increase this figure of merit to as high a level as possible. The ON current ($I_{ON}$) is the ever important parameter used in determining how fast a pixel will charge up. $C_{gs(ON)}$ is the gate-source capacitance in the TFT ON state and determines the pixel voltage drop or shift after switching off the gate.

The reduced channel lengths "L" of TFTs 20 (and the corresponding reduced channel widths) improve LCD viewing characteristics relative to the prior art. For example, in a commonly owned application filed May 19, 1995, entitled "THIN FILM TRANSISTOR WITH REDUCED CHANNEL LENGTH FOR LIQUID CRYSTAL DISPLAYS" (the disclosure of which is hereby incorporated herein by reference) by the instant inventors, an array of linear TFTs with reduced channel lengths was compared to a pair of prior art TFT arrays. All three arrays had TFTs with channel widths of about 24 μm. The two prior art TFT arrays had channel lengths of about 6 μm and the TFT array with reduced channel lengths had channel lengths of about 3 μm. The figure of merit $I_{ON}/C_{gs(ON)}$ in one example was 0.374 for a TFT in the reduced channel length TFT array while corresponding TFTs in the two prior art arrays had $I_{ON}/C_{gs(ON)}$ values of 0.217 and 0.143 respectively. Thus, it is clear that by reducing channel length, $I_{ON}/C_{gs(ON)}$ for the TFT improves thereby reducing pixel flickering, image retention, and gray scale non-uniformity. Additionally, the $C_{gs}$ value may be even further reduced while maintaining the same TFT ON current by reducing the channel width "W" of TFT 20 as will be appreciated by those of skill in the art.

FIG. 6 is a top view of linear TFT 20 where source 22 and drain 24 are illustrated cross-sectionally. Gate 28 and semiconductor layer 32 are illustrated beneath source 22 and drain 24 in a top elevational manner.

FIG. 7 is a top view of U-shaped TFT 80 according to another embodiment of this invention, where source electrode 22 and drain electrode 24 are illustrated cross-sectionally while gate 28 is illustrated in a top elevational manner. FIGS. 8(a) and 8(b) are likewise top views of U-shaped TFT 80 which illustrate the advantages of TFT 80 with respect to reducing the problem of overlay error.

TFT 80 may be manufactured so as to have a reduced channel length "L" (e.g. about 3–6 μm) in the same manner as TFT 20 in accordance with the steps described with respect to FIGS. 3(a)–3(c). Thus, source 22 of TFT 80 includes ITO portion 42, Cr layer 40, and n+ a-Si contact layer 34 while drain 24 includes Mo layer 38 and n+ a-Si contact layer 34.

In typical prior art linear TFTs, a problem develops with variation in source-drain overlay error. TFT 80 overcomes this problem by designing drain 24 and source 22 so as to define a U-shaped TFT channel between the source and drain. When overlay accuracy varies in the X or horizontal direction, the shorter channel length in one branch of the U-shaped channel is almost completely cancelled out by an increase in channel length in the other branch as shown in FIGS. 8(a) and 8(b). In the Y direction dependence of channel length on overlay accuracy between the source and drain remains, but the contribution of the bottom of the U-shaped channel to the total TFT ON current is relatively small and thus its effect is minor.

$I_{ON}$ of the two different TFTs 80 shown in FIGS. 8(a) and 8(b) is a function of W/L where "W" is the channel width and "L" is the TFT channel length. In spite of the overlay error differences between FIGS. 8(a) and 8(b), the two TFTs have substantially the same $I_{ON}$ values as shown by way of the following two equations where $I_{ON1}$ corresponds to the FIG. 8(a) TFT and $I_{ON2}$ corresponds to the FIG. 8(b) TFT:

$$I_{ON1}=(W/L_1+W/L_2+\text{constant})$$

$$I_{ON2}=(W/L_3+W/L_4+\text{constant})$$

Thus, due to the U-shaped design of TFT 80, overlay error or misalignment problems are substantially reduced in view of the fact that $I_{ON1}$ and $I_{ON2}$ for the FIG. 8(a) and 8(b) TFTs respectively are substantially equal even though source 22 is located in the left side of the channel in FIG. 8(a) and on the right side of the TFT channel in FIG. 8(b) due to overlay error.

Once given the above disclosure, many other features, modifications, and improvements will become apparent to the skilled artisan. Such other features, modifications, and improvements are therefore considered to be a part of this invention, the scope of which is to be determined by the following claims:

We claim:

1. A method of making a thin film transistor (TFT), the method comprising the steps of:

providing a substrate;

depositing and patterning a gate electrode on said substrate;

depositing a gate insulating layer over said gate electrode;

vapor depositing a semiconductor layer and a doped semiconductor layer over said gate insulating layer;

depositing a source metal layer over said doped semiconductor layer;

patterning said source metal layer, said doped semiconductor layer, and said semiconductor layer so as to form a thin film transistor area or island;

depositing a substantially transparent metal layer over said substrate and said patterned source metal layer;

patterning said substantially transparent metal layer into a pixel electrode portion and a source electrode portion;

etching said source metal so as to leave said source metal in the transistor area substantially only under the source electrode portion of the patterned substantially transparent metal layer to form a source electrode; and depositing and patterning a drain metal layer to form a drain electrode in order to form the thin film transistor, whereby the channel length of the transistor is defined by and between said source and drain electrodes.

2. The method of claim 1, wherein said depositing and patterning of said drain metal is done after both of said patterning and said etching of said source metal, and wherein said source electrode is etched so that said source metal and the source electrode portion of the substantially transparent metal combine to define the channel length with said drain electrode.

3. The method of claim 2, wherein said source and drain electrodes are patterned so that the transistor channel length is less than about 4 μm thereby increasing $I_{ON}/C_{gs(ON)}$ of the transistor in order to reduce pixel flickering and image retention in liquid crystal display applications.

4. The method of claim 3, wherein said source and drain electrodes are formed so that the TFT channel length is less than or equal to about 3 μm.

5. The method of claim 1, wherein the etchant used for patterning the drain metal is different than the etchant used on the source metal.

6. The method of claim 5, wherein the drain metal is Mo and the source metal is Cr.

7. The method of claim 5, wherein the gate electrode is deposited to a thickness of from about 2,000 Å to 3,000 Å, said substantially transparent metal is deposited to a thickness of from about 1,200 Å to 1,500 Å, and said source metal is deposited to a thickness of from about 500 to 2,000 Å.

8. The method of claim 1, further comprising the step of, after said patterning of the drain electrode, again etching the doped semiconductor layer between the source and drain electrodes so as to form the transistor channel so that only the semiconductor layer remains between the source and drain.

9. The method of claim 8, wherein the second etching of the doped semiconductor layer follows said etching of the source metal from the channel area of the transistor area.

10. The method of claim 1, wherein the method steps are performed in the order recited.

11. A method of making a TFT, the method comprising the steps of:
 a) depositing and patterning a gate metal on a substrate to form a gate electrode;
 b) depositing and patterning a semiconductor layer, a doped semiconductor contact layer, and a source metal layer over the gate electrode to form a TFT island or region, the doped semiconductor layer being deposited between the semiconductor layer and the source metal layer;
 c) depositing and patterning over the source metal layer a substantially transparent metal layer so as to form a pixel electrode portion and a source electrode portion;
 d) etching the source metal layer after said patterning in step c) so that the source metal is substantially etched except for under the source electrode portion of the substantially transparent metal layer thereby forming a source electrode; and
 e) depositing and patterning a drain metal to form a drain electrode so that the TFT channel length is defined between the source electrode and the drain electrode.

12. The method of claim 11, wherein steps b)–e) are performed so that the resulting TFT channel length is less than about 4 µm thereby increasing $I_{ON}/C_{gs(ON)}$ of the TFT so as to reduce pixel flickering and image retention in LCD applications.

13. The method of claim 12, wherein the drain metal is etched using a different etchant than the etchant used for etching the source metal, and the semiconductor layer is made of a-Si.

14. A method of making a liquid crystal display including an array of a-Si TFTs, the method comprising the steps of:
 providing first and second substrates for sandwiching a liquid crystal layer therebetween;
 forming a gate electrode on said first substrate;
 forming a gate insulating layer over the gate electrode;
 forming an a-Si semiconductor layer over the gate insulating layer;
 forming a source metal layer over the a-Si semiconductor layer;
 patterning the source metal layer and the a-Si semiconductor layer to form a TFT island;
 forming a substantially transparent layer over the TFT island and patterning the substantially transparent layer to form a pixel electrode portion and a source electrode portion;
 etching the source metal so as to leave the source metal in the TFT island substantially under only the source electrode portion of the substantially transparent layer in order to form a TFT source electrode;
 forming and patterning a drain metal layer of a metal different than that of the source metal layer to form a TFT drain electrode so that the TFT channel length is defined by and between the source and drain electrodes; and
 sandwiching the liquid crystal layer between the first and second substrates to form the a-Si TFT liquid crystal display.

* * * * *